(12) United States Patent
Asano

(10) Patent No.: US 7,476,473 B2
(45) Date of Patent: Jan. 13, 2009

(54) PROCESS CONTROL METHOD, A METHOD FOR FORMING MONITOR MARKS, A MASK FOR PROCESS CONTROL, AND A SEMICONDUCTOR DEVICE MANUFACTURING METHOD

(75) Inventor: Masafumi Asano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 610 days.

(21) Appl. No.: 11/198,368

(22) Filed: Aug. 8, 2005

(65) Prior Publication Data

US 2006/0035158 A1 Feb. 16, 2006

(30) Foreign Application Priority Data

Aug. 9, 2004 (JP) ............................ P2004-232572

(51) Int. Cl.
*G03F 9/00* (2006.01)
*G03C 5/00* (2006.01)

(52) U.S. Cl. .............................. 430/5; 430/30; 430/330; 382/145; 382/149; 382/151

(58) Field of Classification Search .................... 430/5, 430/30, 330; 382/145, 149, 151
See application file for complete search history.

(56) References Cited

U.S. PATENT DOCUMENTS

| 6,226,074 B1 | 5/2001 | Fujisawa et al. |
| 6,866,976 B2 | 3/2005 | Asano et al. |
| 2005/0008979 A1 | 1/2005 | Hayasaki et al. |

*Primary Examiner*—Christopher G Young
(74) *Attorney, Agent, or Firm*—Finnegan, Henderson, Farabow, Garrett & Dunner, L.L.P.

(57) ABSTRACT

A process control method includes forming an inspection pattern having a first line and a plurality of second lines being parallel with the first line, and a reference pattern being in the orthogonal direction to the direction in which the first line extends, flowing the inspection pattern and the reference pattern measuring the distance between the center of the inspection and the reference pattern after flowing the inspection and the reference pattern, and checking the magnitude of variation in increases of line widths of the inspection and the reference pattern after the flowing the inspection and the reference pattern.

17 Claims, 16 Drawing Sheets

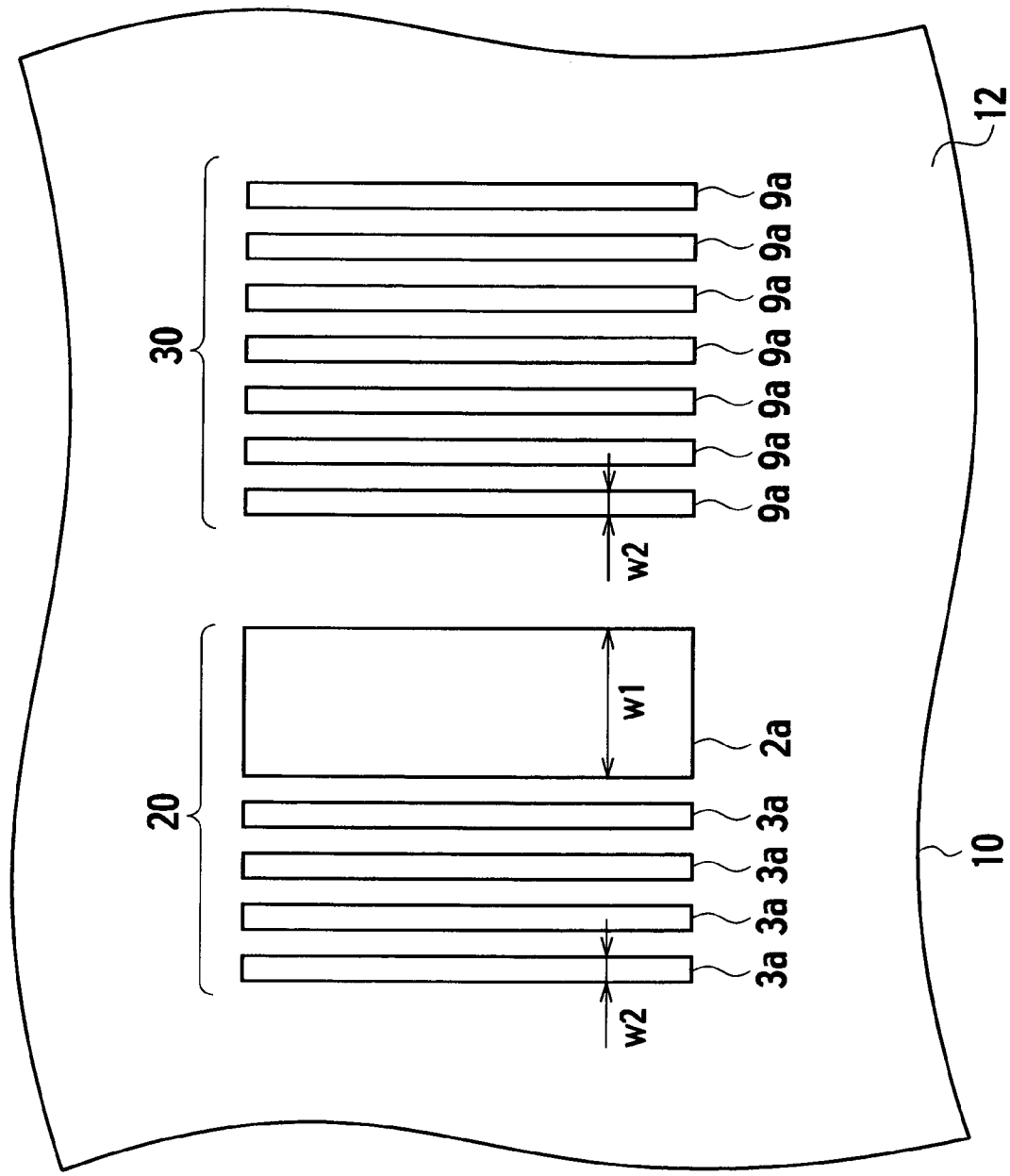

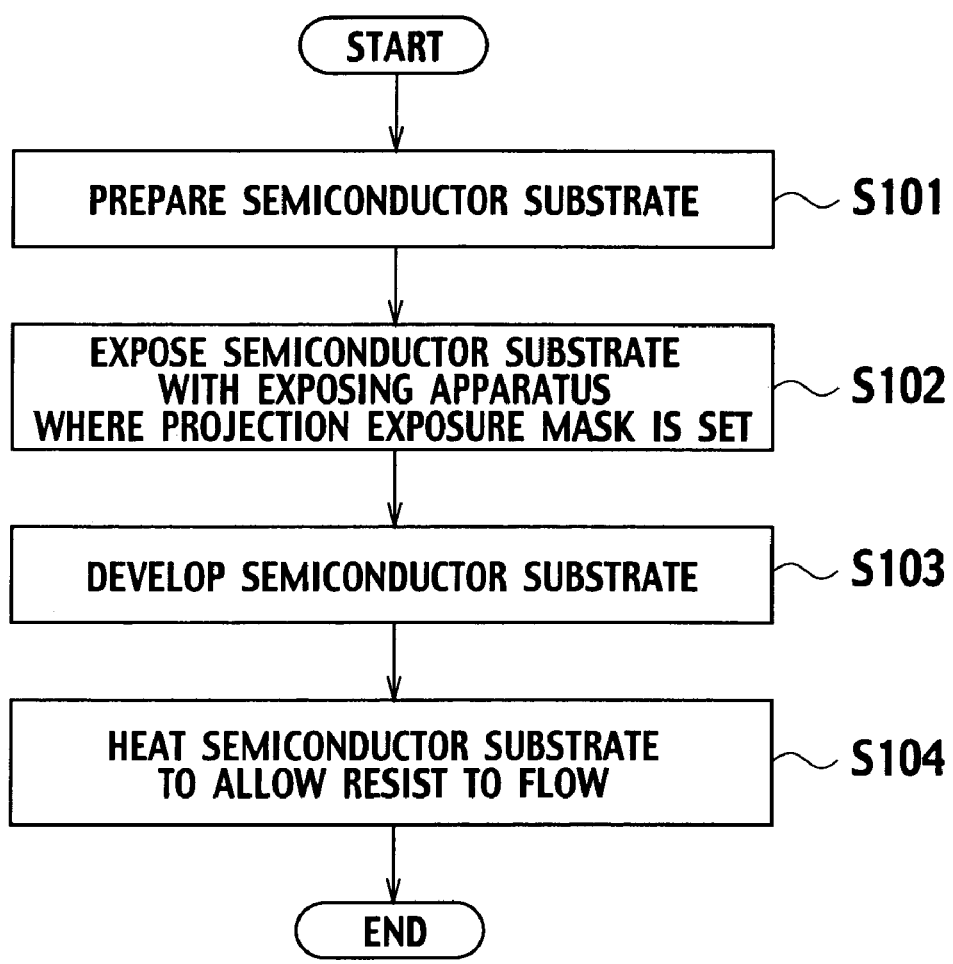

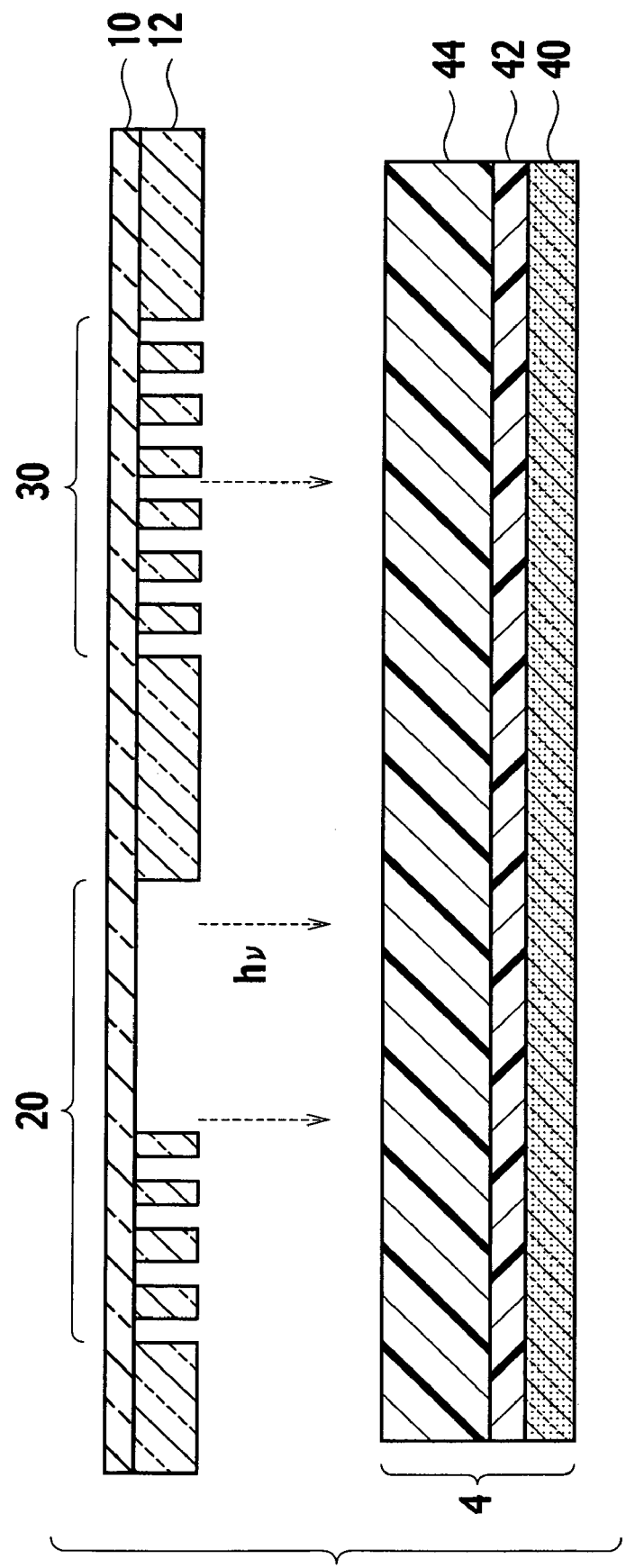

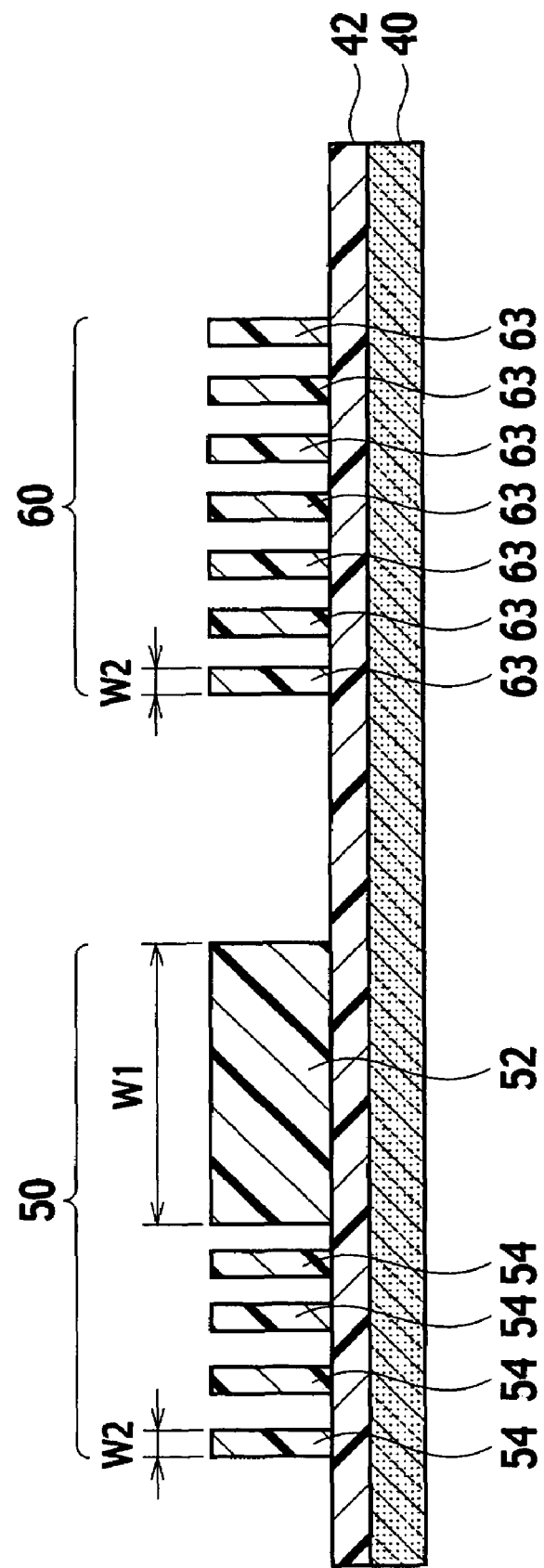

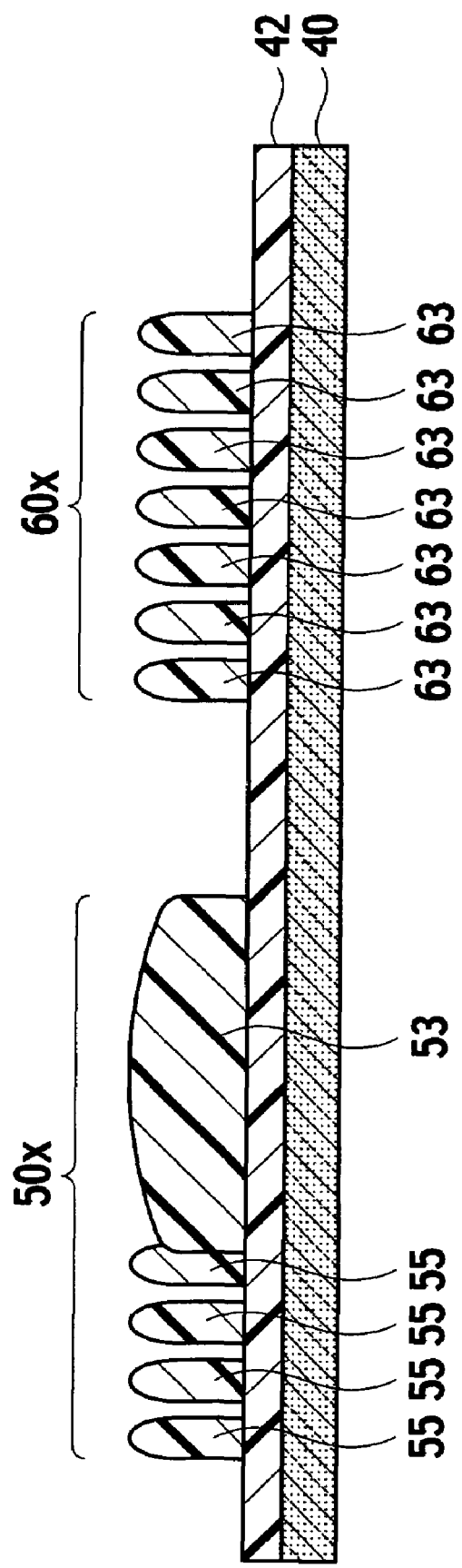

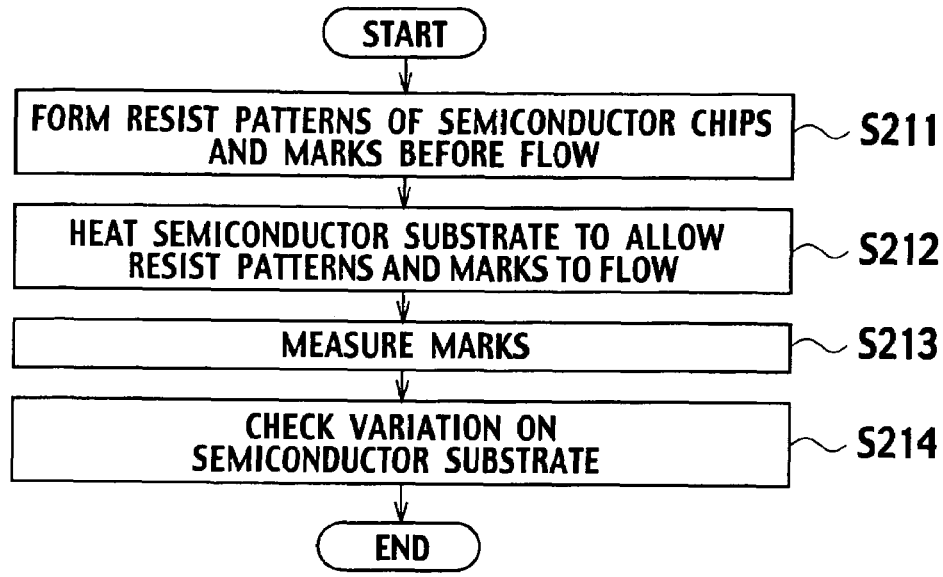
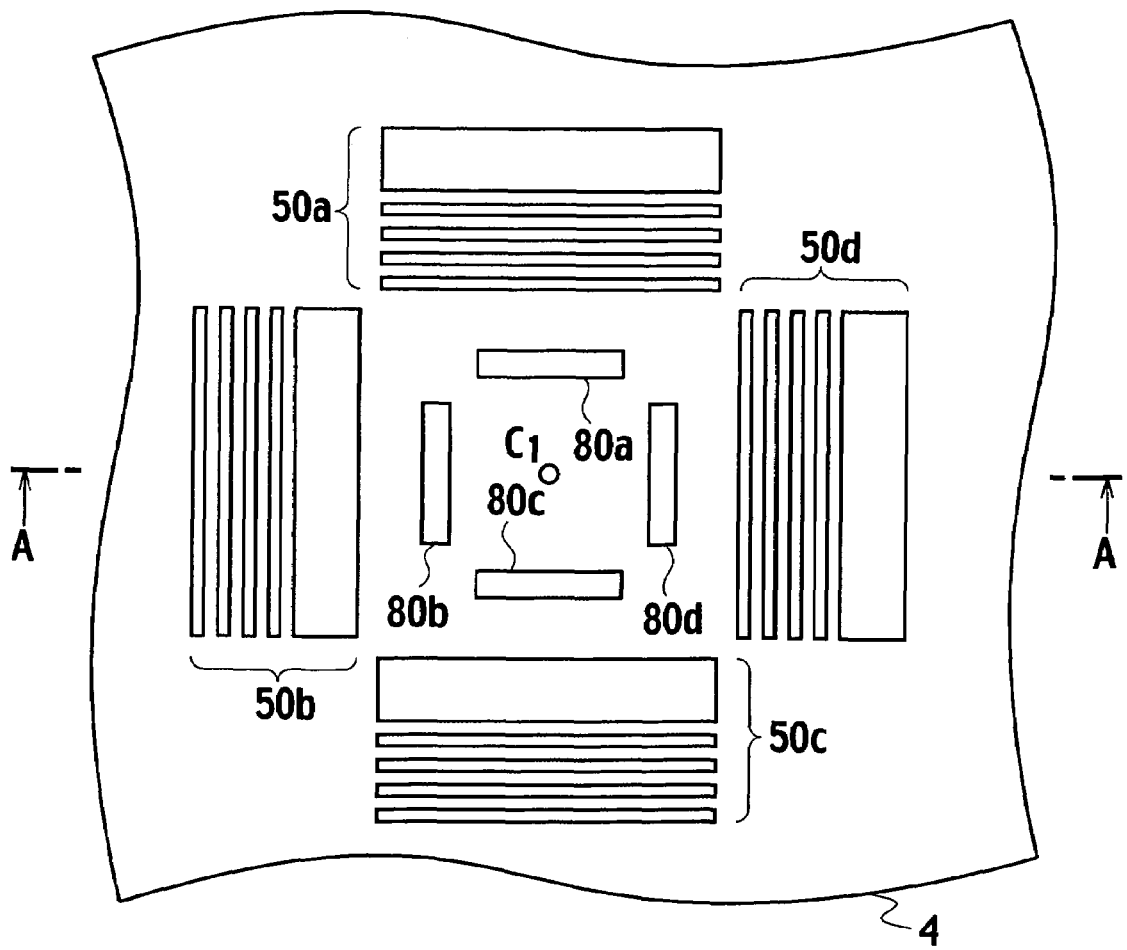

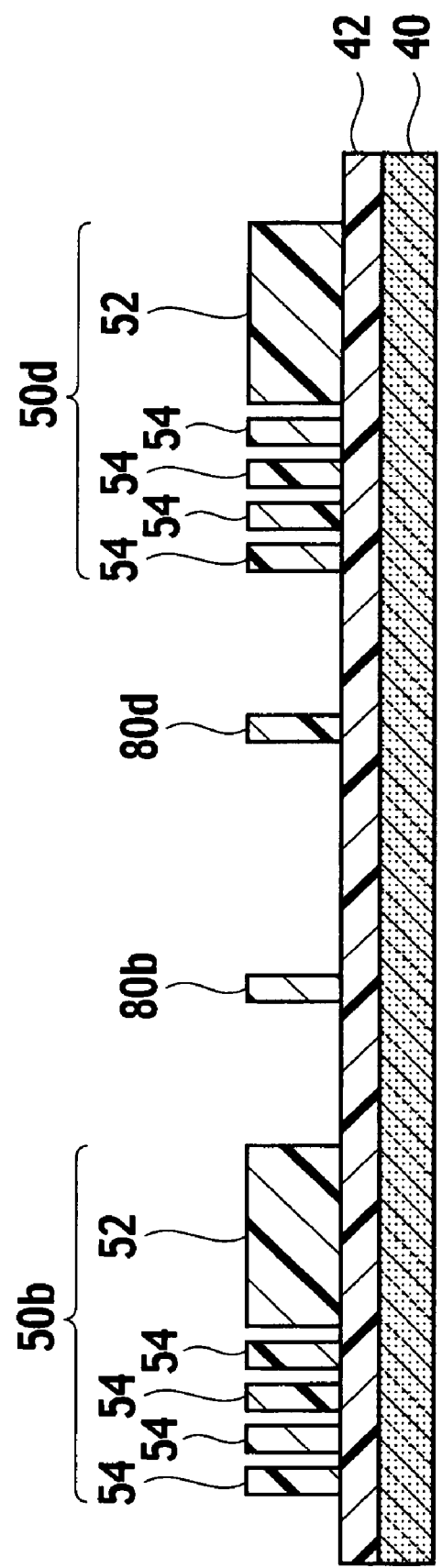

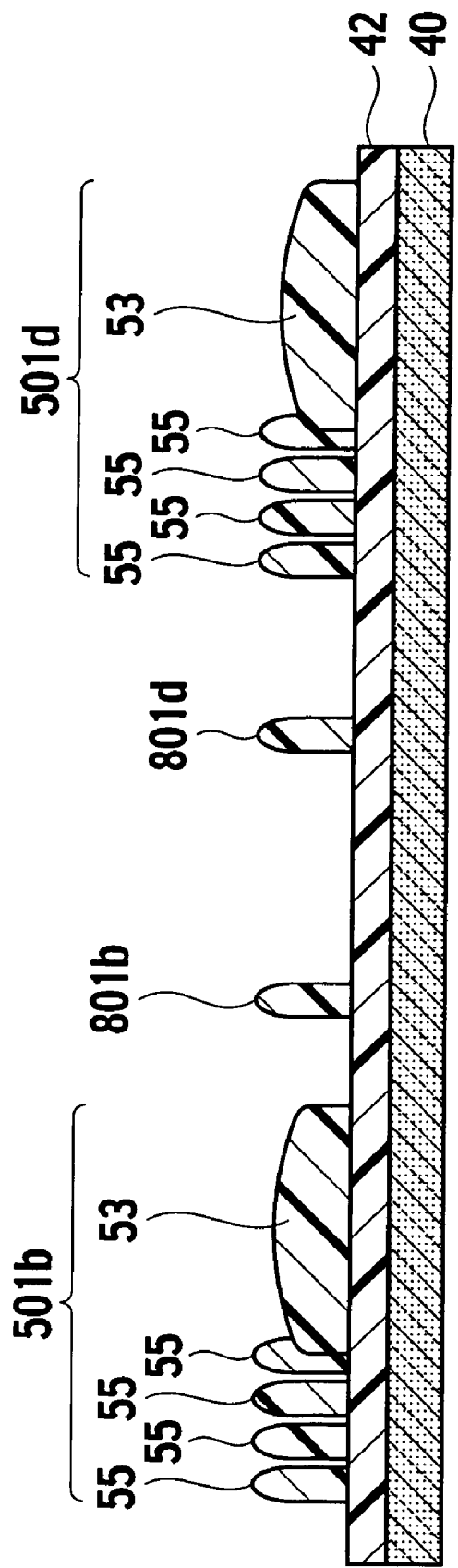

PROCESS CONTROL METHOD, A METHOD FOR FORMING MONITOR MARKS, A MASK FOR PROCESS CONTROL, AND A SEMICONDUCTOR DEVICE MANUFACTURING METHOD

CROSS REFERENCE TO RELATED APPLICATIONS AND INCORPORATION BY REFERENCE

This application is based on and claims the benefit of priority from the prior Japanese Patent Applications No. P2004-232572, filed on Aug. 9, 2004; the entire contents of which are incorporated herein by reference.

BACKGROUND OF THE INVENTION

1. Field of the Invention

The present invention relates to manufacturing of semiconductor devices and specifically to a process control method, a method for forming monitor marks, and a mask for process control used in a lithography process.

2. Description of the Related Art

During lithography, a manufacturing process of semiconductor devices, a mask pattern is first projected onto a resist formed on a wafer using an exposure optical system. Then, the resist, on which the mask pattern has been exposed, is developed form to a resist pattern.

In recent years, as design rules for semiconductor devices have grown finer, there have been increasing demands for higher lithographic resolution. However, lithography resolution has its limits and it has become more difficult to achieve line requirements. However, by heating a formed resist pattern, the shape of a resist pattern changes (flows) and spacing between lines is narrowed. Thus, a resist pattern with a desired line width is obtained.

In order to obtain a resist pattern having desired line widths by allowing the resist to flow, it is required to control variation in changes of line widths of a resist pattern due to the flow within a wafer surface or the like. Line width variations of a resist pattern due to a flow are controlled by a critical dimension scanning electron microscope (a CD-SEM). However, as an optical inspection apparatus, the CD-SEM does not have sufficient resolution. Such control using a CD-SEM also has problems, such as low throughput and the like.

SUMMARY OF THE INVENTION

An aspect of the present invention inheres in a process control method including forming an inspection pattern by a resist having a first line and a plurality of second lines having a line width smaller than that of the first line pattern and being parallel with the first line, and a reference pattern being in the orthogonal direction to the direction in which the first line extends on a semiconductor substrate, flowing the inspection pattern and the reference pattern by heating the resist, measuring the distance between the center of the inspection pattern and the reference pattern after flowing the inspection pattern and the reference pattern, and checking the magnitude of variation in increases of line widths of the inspection pattern and the reference pattern after the flowing the inspection pattern and the reference pattern, based on the measurement result of the distance between the centers.

Another aspect of the present invention inheres in a process control method including forming four outer marks in a rectangular shape by a resist, divided into two orthogonal sets of marks, each of the outer marks having a first line and a plurality of second lines having a line width smaller than that of the first line and in parallel with the first line, and four inner marks being arranged in a rectangular shape on inner sides of the outer marks parallel with the outer marks respectively on a semiconductor substrate, flowing the outer marks and the inner marks by heating the resist, measuring the distance between the center of the outer marks and the inner marks after flowing the outer marks and the inner marks, and checking the magnitude of variation in increases of line widths of the outer marks and the inner marks after the flowing the outer marks and the inner marks, based on the measurement result of the distance between the centers.

Another aspect of the present invention inheres in a method for forming a monitor mark configured to measure a distance between the center of an inspection pattern and a reference pattern after a flow process including forming the inspection pattern in a rectangular shape by a resist having a first line and a plurality of second lines having a line width smaller than that of the first line and being parallel with the first line, and a reference pattern being in the orthogonal direction to the direction in which the first line extends on a semiconductor substrate, and flowing the inspection pattern and the reference pattern by heating the resist.

Another aspect of the present invention inheres in a method for forming a monitor mark configured to measure a distance between the center of an outer mark and an inner mark after a flow process including forming the outer marks in a rectangular shape by a resist, divided into two orthogonal sets of marks, each of the outer marks having a first line and a plurality of second lines having a line width smaller than that of the first line and in parallel with the first line, and the inner marks being arranged in a rectangular shape on inner sides of the outer marks parallel with the outer marks respectively on a semiconductor substrate, and flowing the outer marks and the inner marks by heating the resist.

Another aspect of the present invention inheres in a mask for process control flowing of an inspection pattern and a reference pattern having a first line and a second line which were projected by heating an exposure object, and measuring the distance between the center of the inspection pattern and the reference pattern after a flow including a mask substrate, a first mask pattern having a first line pattern and a plurality of second line patterns having a line width smaller than that of the first line pattern and being parallel with the first line pattern, the first mask pattern being formed on the mask substrate, and a second mask pattern having a third line pattern being in the orthogonal direction to the direction in which the first line pattern extends, and being formed on the mask substrate.

Another aspect of the present invention inheres in a mask for measuring the distance between the center of an inspection pattern and a reference pattern after flowing the inspection pattern and the reference pattern having first and second lines by heating an exposure object including a mask substrate, four outer mask patterns arranged in a rectangular shape on the mask substrate, being divided into two orthogonal sets of patterns, each of the outer mask patterns having a first line pattern and a plurality of second line patterns having a line width smaller than that of the first line pattern and being parallel with the first line, and four inner mask patterns arranged in a rectangular shape on the mask substrate on inner sides of the rectangular arrangement of the outer mask patterns in parallel with the outer mask patterns respectively.

Another aspect of the present invention inheres in a semiconductor device manufacturing method including forming an inspection pattern by a resist having a first line and a plurality of second lines having a line width smaller than that of the first line pattern and being in parallel with the first line, and a reference pattern being orthogonal to the direction in which the first line extends on a semiconductor substrate, flowing the inspection pattern and the reference pattern by heating the resist, measuring distance between the center of the inspection pattern and the reference pattern after flowing the inspection pattern and the reference pattern, and checking the magnitude of variation in increases of line widths of the inspection pattern and the reference pattern after the flowing the inspection pattern and the reference pattern, based on the measurement result of the distance between the centers.

BRIEF DESCRIPTION OF DRAWINGS

FIG. 1 is a plane view of a mask for process control according to a first embodiment of the present invention.

FIG. 2 is a flow chart showing a method for forming monitor marks on a resist according to the first embodiment of the present invention.

FIG. 3 is a process cross-sectional view of the mask formation for process controls according to the first embodiment of the present invention.

FIG. 4 is a process cross-sectional view after the process shown in FIG. 3 of the mask formation for process controls according to the first embodiment of the present invention.

FIG. 5 is a process cross-sectional view after the process shown in FIG. 4 of the mask formation for process controls according to the first embodiment of the present invention.

FIG. 13 is a flow chart showing a method for forming monitor marks on a resist according to the second embodiment of the present invention.

FIG. 14 is a plane view of a monitor mark according to the second embodiment of the present invention.

FIG. 15 is a cross-sectional view before performing a flow of the monitor mark according to the second embodiment of the present invention.

FIG. 16 is a cross-sectional view after performing a flow of the monitor mark according to the second embodiment of the present invention.

DETAILED DESCRIPTION OF THE INVENTION

Figure 6A:
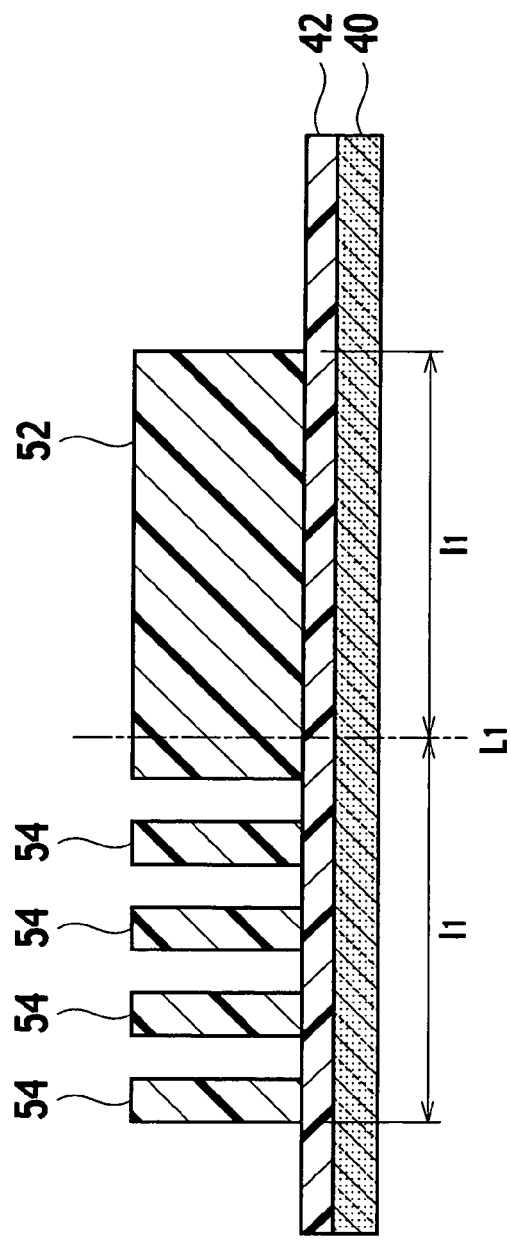
FIG. 6A is a cross-sectional view before performing a flow of a monitor mark according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details.

First Embodiment

As shown in FIG. 1, a mask for process control according to the first embodiment of the present invention includes a translucent mask substrate 10 made of glass or the like, and first and second mask patterns 20 and 30 provided in a light-shielding layer 12 on the mask substrate 10. The first and second mask patterns 20 and 30 are transparent parts for transmitting light, electron beams (EB) and the like through the mask substrate 10. Although FIG. 1 describes a single first mask pattern 20 and second mask pattern 30, in reality a plurality of first and second mask patterns 20 and 30 are scattered over the mask substrate 10.

The first mask pattern 20 has a first line pattern 2a having a line width W1 and a plurality of second line patterns 3a having a line width W2 smaller than that of the first line pattern 2a, parallel and next to the first line pattern 2a. The first line pattern 2a is placed on either the right or left side of the first mask pattern 20.

The second mask pattern 30 is placed beside the first mask pattern 20 in the orthogonal direction to the direction in which the first mask pattern 20 extends. In the second mask pattern 30, a plurality of third line patterns 9a having a single line width (for example, the line width W2 in FIG. 1) is provided. Here, the plurality of third line patterns 9a may be a single line.

A method for manufacturing the mask for process control according to the first embodiment will be described. First of all, layout data (design data) including a design pattern of a semiconductor integrated circuit, the first mask pattern 20, and the second mask pattern 30 are generated. Next, by using an electron beam lithography apparatus (a pattern generator), the generated layout data is transformed into drawing data. The respective pattern data of masks (drawing mask data) is determined by using a CAD system. Further, an electron beam lithography apparatus draws the patterns on the mask substrate 10 using the pattern data, thus completing a mask for process control.

Hereinbelow, a description is provided of a method for forming monitor marks on a resist using the mask for process control according to the first embodiment, with reference to the flowchart shown in FIG. 2.

In the step S101 shown in FIG. 2, a semiconductor substrate 4 is mounted on a stage of an excimer laser exposure apparatus (not shown). On the semiconductor substrate 4, a resist 44 is applied on an antireflective film 42 formed on a wafer 40 as shown in FIG. 3. For the resist 44, a negative resist is used.

In step S102, the resist 44 of the semiconductor substrate 4 is exposed by, for example, a krypton-fluoride (KrF) excimer laser apparatus with a numerical aperture (NA) of 0.68, where the mask for process control shown in FIG. 1 is set. The exposure of the resist 44 is carried out by light transmitted through the first and second mask patterns 20 and 30 shown in FIG. 3.

In step S103, the exposed semiconductor substrate 4 is developed. As a result, an inspection pattern 50 transferred from the first mask pattern 20 and a reference pattern 60 transferred from the second mask pattern 30 are formed on the resist 44 as shown in FIG. 4. The inspection pattern 50 includes a first line 52 with a line width of W1 and a plurality of second lines 54 with a line width W2. The reference pattern 60 includes a plurality of third lines 62 with single line width W2, corresponding to the second lines 54.

Next, in step S104, the semiconductor substrate 4 is heated by a heating apparatus such as a hot plate or an oven. Heating conditions can be selected as appropriate depending on a kind of resist and line widths of patterns, and the semiconductor substrate 4 is heated, for example, at 164 degrees centigrade for 60 seconds. By heating the semiconductor substrate 4, the inspection pattern 50 and the reference pattern 60 are melted to a flow state, and monitor marks, each having a modified inspection pattern $50x$ and a modified reference pattern $60x$ are formed as shown in FIG. 5. The modified inspection pattern $50x$ includes a first modified line 53 and a plurality of second modified lines 55. In addition, the modified reference pattern $60x$ includes a plurality of third modified lines 63.

Figure 6B:
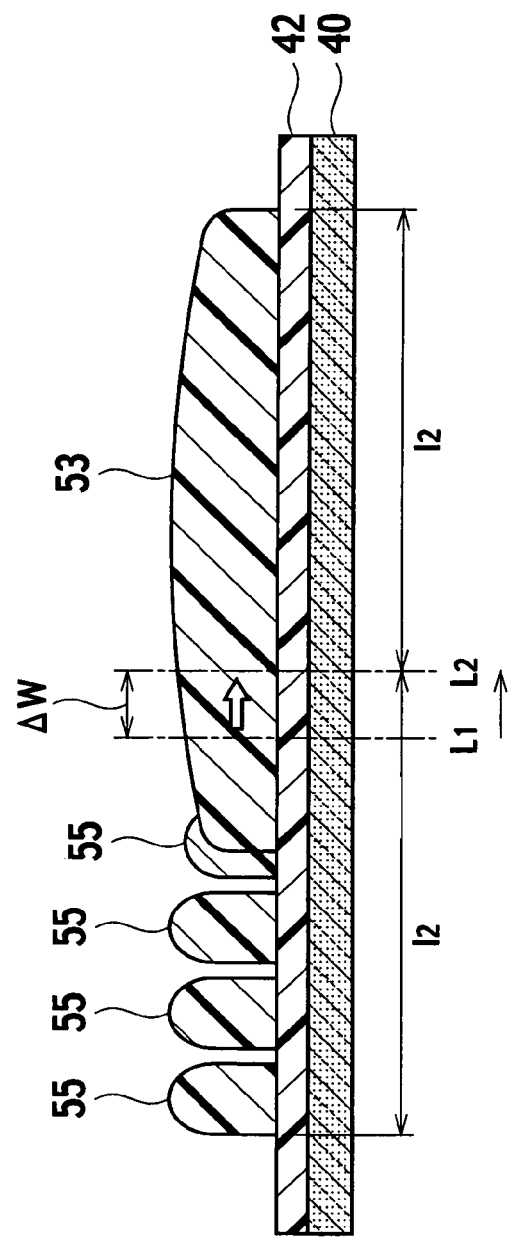
FIG. 6B is a cross-sectional view after performing a flow of the monitor mark according to the first embodiment of the present invention.

A difference between a monitor mark before and after the flow of the reference patterns 50 and 60 is described with reference to FIGS. 6A and 6B. FIG. 6A is a cross-sectional view of the inspection pattern 50 formed by the aforementioned method before the flow of the reference pattern. FIG. 6B is a cross-sectional view of the modified inspection pattern $50x$ after the flow of the reference pattern. The center of the inspection pattern 50 before the flow, shown in FIG. 6A, is indicated by a center line $L_1$, at a distance $l_1$ from both sides of the inspection pattern 50. Next, the center of the modified inspection pattern $50x$, after the flow shown in FIG. 6B, is indicated by a center line $L_2$, at a distance $l_2$ from both sides of the modified inspection pattern $50x$. FIG. 6B also shows the center line $L_1$ of the inspection pattern 50 depicted in FIG. 6A. As shown by an arrow in FIG. 6B, by allowing the resist to flow, the center of the inspection pattern 50 moves, by a movement width $\Delta W$, to the side where the first line 52 is positioned. The center line $L_1$ of the inspection pattern 50 moves along with the flow because, with some large line width of a pattern, a line width increases by the flow. On the other hand, with a small line width, a line width does not change so much even after the flow of the reference patterns. The center of the reference pattern 60 does not move, even if the resist flows, since the third lines 62 have a single line width. In other words, where a pattern has different line widths on both sides thereof, the amount of change in the pattern is different on both sides thereof, from which, it can be understood that the center position of the entire inspection pattern 50 moves.

Figure 7:
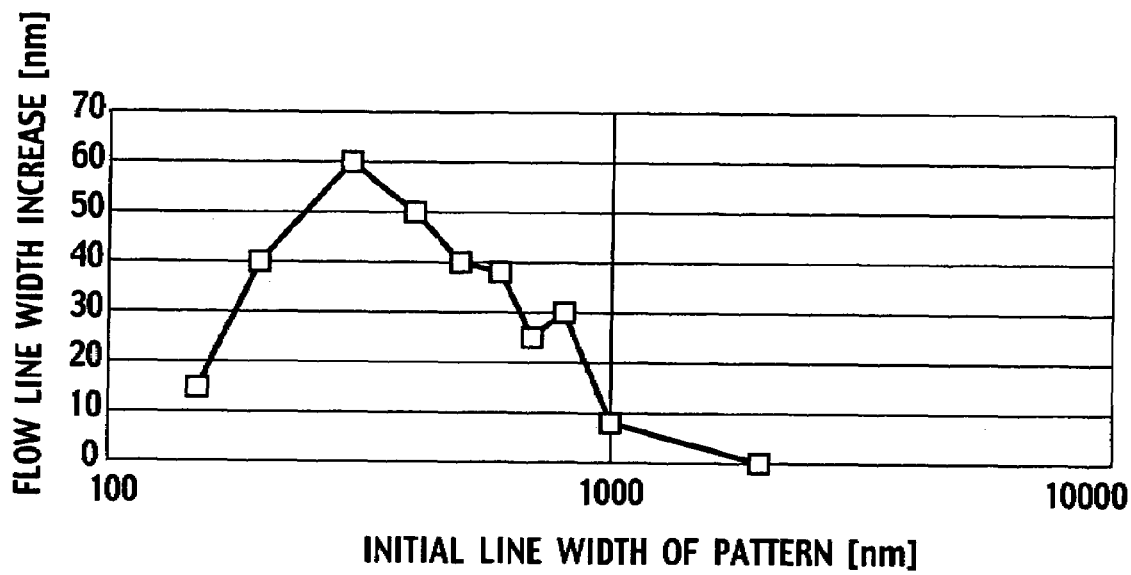
FIG. 7 is a graph to show a relation between a line width of a pattern of the monitor mark and an increase in the line width due to the flow according to the first embodiment of the present invention.

The graph of FIG. 7 is an example of a relation between a line width of a pattern and an increase in the line width due to the flow. In this graph, a line width of a pattern increases up to about 500 nm due to the flow. However, the graph also shows that, once the line width of a pattern exceeds about 500 nm, the amount of increase in the line width due to the flow starts to decrease. In other words, by placing a pattern, like the inspection pattern 50, with a line width increased to a maximum an increase amount of the line width due to the flow, on either the right or left end of a mark, the center of the mark will move. Where the first line 52 has a pattern with a maximized line width due to the flow, and the second lines 54 have a pattern of a line width which does not change even if the second lines 54 flow, there will be a large movement width $\Delta W$ of the center of the mark. A value of a line width of a pattern having maximum an increase in the line width by the flow varies depending on the thickness and kind of a resist and the like.

Hereinbelow, a process control method using the monitor mark formed by the mask for process control according to the first embodiment is described with reference to the flowchart in FIG. 8.

Figure 8:
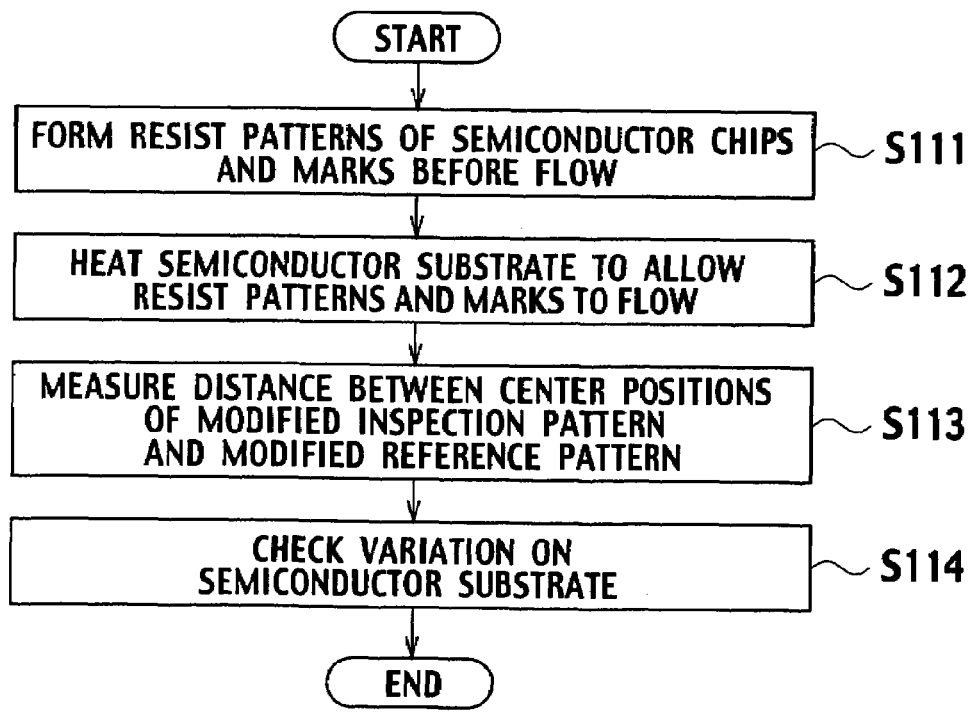
FIG. 8 is a flow chart showing a process control method according to the first embodiment of the present invention.
Figure 10:
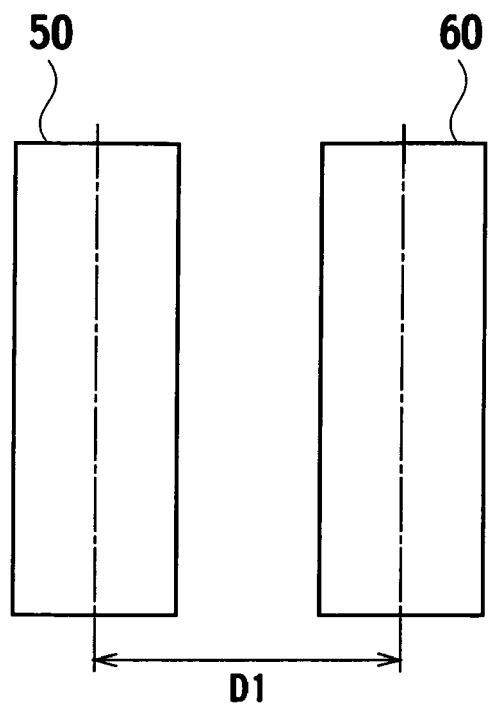
FIG. 10 is a plane view of the first pattern and the second pattern before performing a flow of the monitor mark according to the first embodiment of the present invention.

In the step S111 shown in FIG. 8, the mask for process control according to the first embodiment is transferred onto a resist 44 of a semiconductor substrate 4. In the semiconductor substrate 4, a resist 44 is applied onto an antireflective film 42 formed on a wafer 40. Thus, resist patterns (details are omitted) 46 of semiconductor chips and monitor marks (shown as shaded parts) are formed prior to the flow process. The monitor marks are provided in spaces on the resist patterns 46 that one not used as semiconductor chips or dicing lines. The number of monitor marks provided on a single wafer is, for example, 30. As shown in FIG. 4, each of the monitor marks has at least one inspection pattern 50 and one reference pattern 60. As shown in FIG. 10, a distance between the centers of the inspection pattern 50 and the reference pattern 60 is set at D1.

Next, in step S112, the semiconductor substrate 4 is heated by a heating apparatus such as a hot plate or an oven. The resist patterns 46 and the monitor marks on the heated semiconductor substrate 4 flow as shown in FIG. 5. By allowing the resist patterns 46 and the monitor marks to flow, line widths of the semiconductor chips are changed and resist patterns having desired line widths are obtained.

Next, in step S113, the semiconductor substrate 4 is moved to a measuring apparatus (not shown) such as an optical misalignment inspection apparatus. Thereafter, by using the optical measuring apparatus, a distance between the centers of the deformed inspection pattern $50x$ and the deformed reference pattern $60x$, after the flow, is measured for each of the monitor marks scattered over the semiconductor substrate 4.

Figure 11:
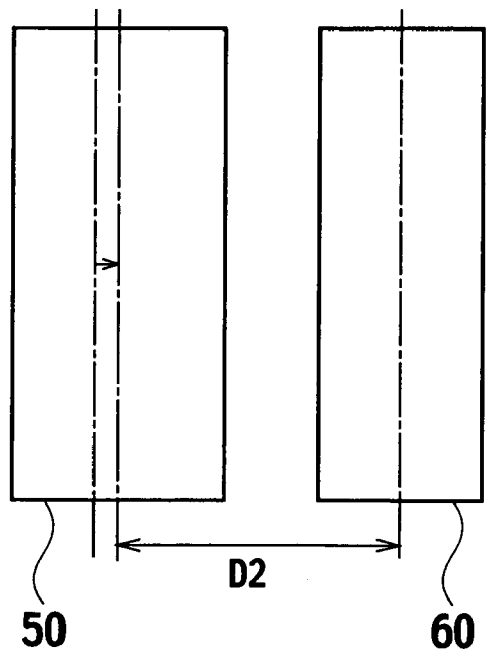
FIG. 11 is a plane view of the first pattern and the second pattern after performing a flow of the monitor mark according to the first embodiment of the present invention.

In step S114, based on the measurement result of the distance between the centers of the deformed inspection pattern $50x$ and the deformed reference pattern $60x$, after the flow for each of the monitor marks, the magnitude of variation in increases of line widths due to the flow on the semiconductor substrate 4 is checked. As shown in FIG. 11, an optimal value of the distance between the centers after the flow is set at D2 which is shorter than D1 when, for example, the center of the inspection pattern 50 moves towards the reference pattern 60. Thereafter, variation in increases in line widths due to the flow in each of the monitor marks is evaluated based on the set value D2, and chips arranged in an area where a large variation in increases in line widths is observed due to the flow are removed as waste chips.

According to the process control method of the first embodiment, the magnitude of variation in the flow on the semiconductor substrate 4 can be controlled by measuring a distance between the centers of the modified inspection pattern 50x and the modified reference pattern 60x. Since increases in line widths due to the flow depend on heating temperature and duration, the increases in line widths due to the flow within a wafer or between wafers vary because of uneven temperature of a heating apparatus. A magnitude of variation in increases in line widths due to the flow on the semiconductor substrate 4 can be measured by using an optical accurately measuring apparatus such as a misalignment inspection apparatus without using an electronic measuring apparatus such as a CD-SEM. Therefore, variation in increases in resist line widths due to the flow can be controlled and provide a high throughput.

Second Embodiment

Figure 12:
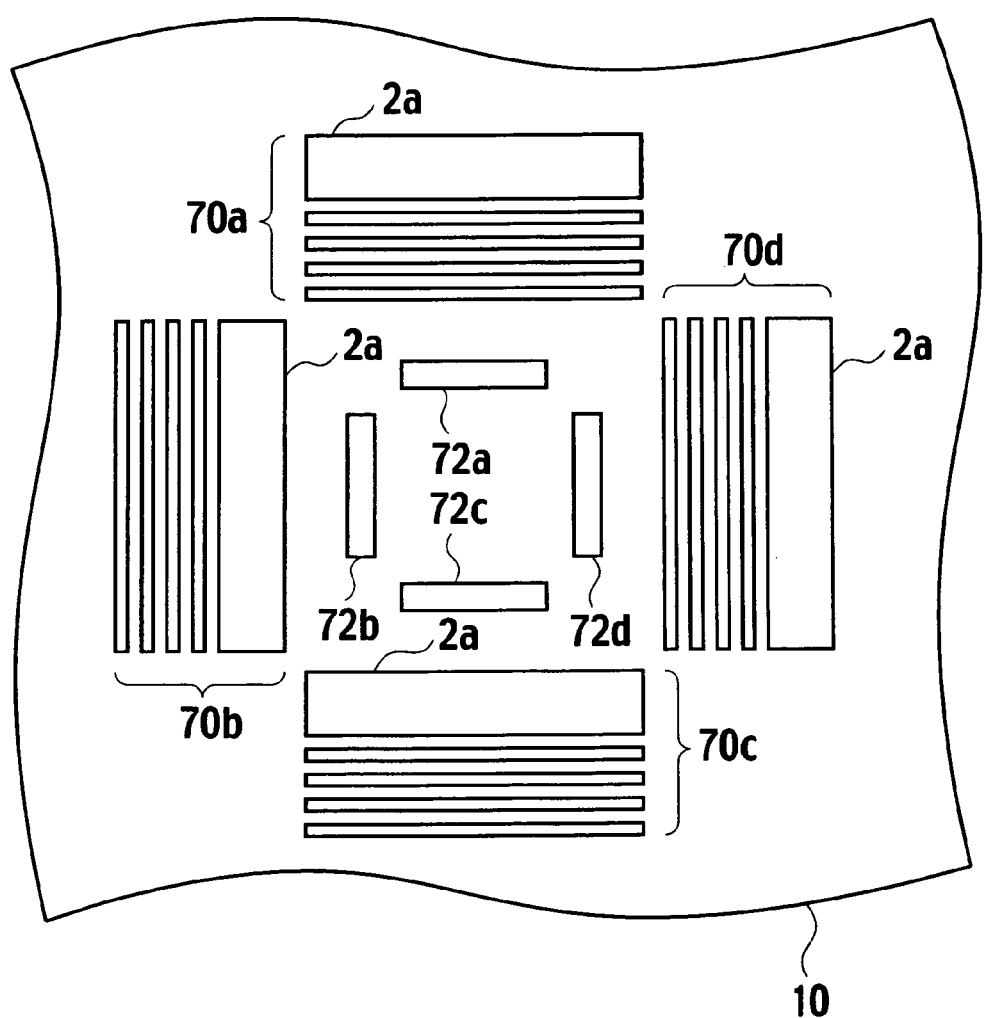
FIG. 12 is a plane view of a mask for process control according to a second embodiment of the present invention.

As shown in FIG. 12, a mask for process control according to the second embodiment of the present invention is different from the mask for process control shown in FIG. 1 in that four of the first mask patterns 20 according to the first embodiment are prepared and these first mask patterns 20 are combined and used as outer mask patterns 70a to 70d. Another difference is that the mask for process control according to the second embodiment is also provided with inner mask patterns 72a to 72d arranged in a rectangular shape on the inner sides of the outer mask patterns 70a to 70d in parallel with the same, respectively. The rest of the structure is substantially the same as the mask for process control shown in FIG. 1 and duplicated description is thus omitted.

As shown in FIG. 12, the outer masks are divided into two orthogonal sets: a set of the outer mask patterns 70a and 70c that face each other in parallel and a set of the outer mask patterns 70b and 70d that also face each other in parallel. The set of the outer mask patterns 70a and 70c and the set of the outer mask patterns 70b and 70d are arranged in a rectangular shape and placed on four sides of a chip. The outer mask patterns 70a to 70d are used to form a resist pattern in which a central position moves due to a flow of the resist. Of the outer mask patterns 70a to 70d, the center positions of those placed in parallel with each other and move in the same direction after the flow. In other words, as for the outer mask patterns 70a and 70d, first line patterns 2a thereof are placed on the outer side of the outer mask patterns 70a to 70d placed on four sides. As for the outer mask patterns 70b and 70c, first line patterns 2a thereof are placed on the inner side of the outer mask patterns 70a to 70d on four sides thereof.

The inner mask pattern 72a and 72c are placed to face each other in parallel, and the inner mask patterns 72b and 72d are placed to face each other in parallel. The inner mask patterns 72a to 72d are placed so that directions in which the inner mask patterns 72a and 72c extend and a direction in which the inner mask patterns 72b and 72d extend are orthogonal to each other. The inner mask patterns 72a to 72d are used to form a resist pattern in which the center position does not move, even if the resist flows. For the inner mask patterns 72a to 72d, a pattern with a single line or a plurality of lines with the same line width or the like can be used.

Hereinbelow, a process control method using monitor marks formed by the mask for process control according to the second embodiment is described with reference to the flowchart in FIG. 13.

Figure 9:
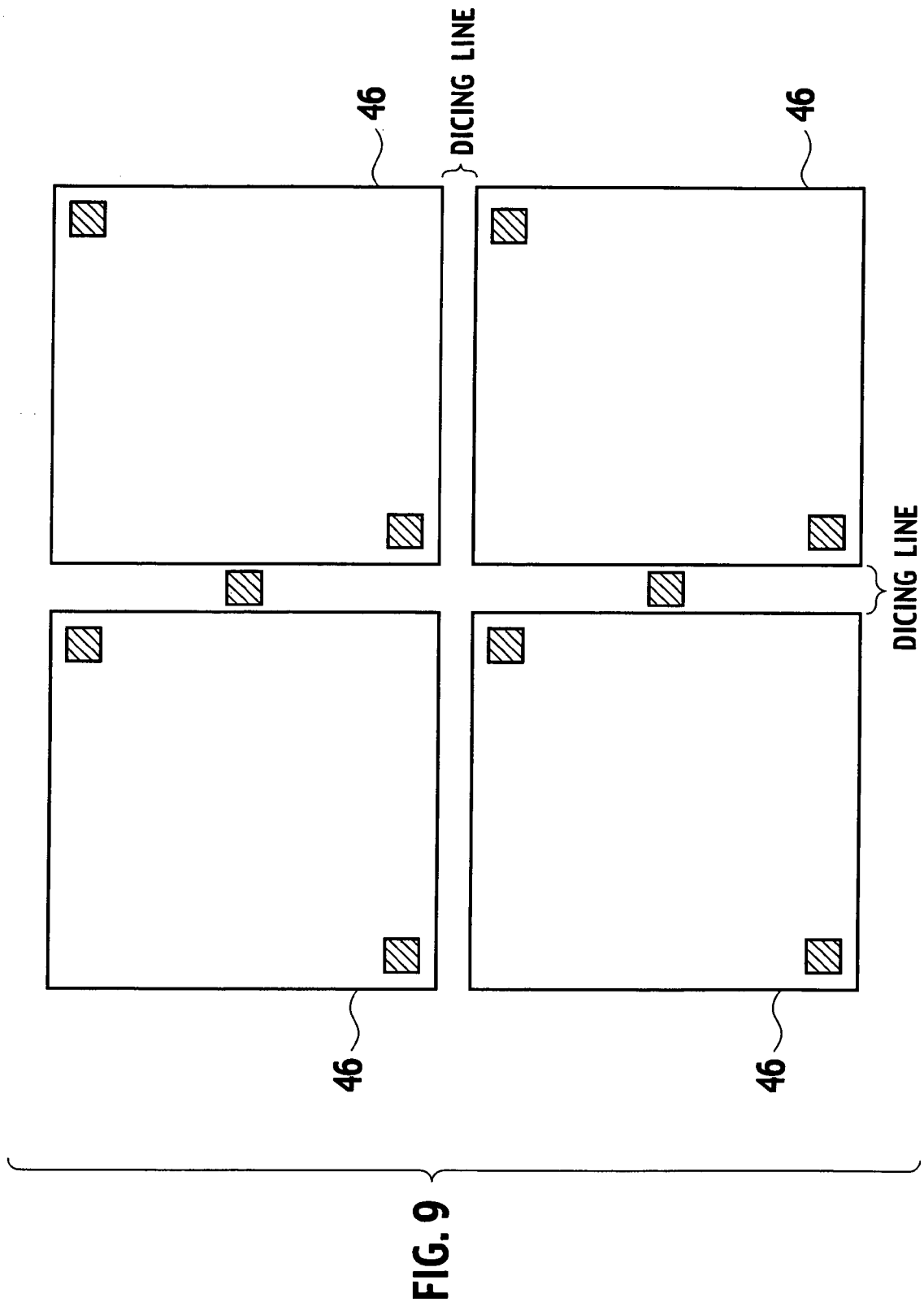
FIG. 9 is a magnified plane view of one part of a wafer transferred on the resist by means of the mask for process controls according to the first embodiment of the present invention.

In step S211 shown in FIG. 13, the mask for process control according to the second embodiment is transferred onto a resist 44 of a semiconductor substrate 4. In the semiconductor substrate 4, a resist 44 is applied onto an antireflective film 42 formed on a wafer 40. Thus, as shown in FIG. 9, resist patterns (details are omitted) 46 of semiconductor chips and monitor marks (shown as shaded parts) prior to the flow, are formed.

The monitor marks are provided on an area of the resist patterns 46 not used as semiconductor chips or dicing lines. The number of monitor marks provided on a single wafer is, for example, 30. As shown in FIGS. 14 and 15, each of the monitor marks prior to the flow, has the outer marks 50a to 50d and the inner marks 80a to 80d. As shown in FIG. 14, the center position of the outer marks 50a to 50d and the center position $C_1$ of the inner marks 80a to 80d coincide with each other. First lines 52 and second lines 54 of the outer marks 50a to 50d have common line widths, respectively. The line width of the first line 52 is, for example, 400 nm. The second lines 54 are, for example, a 150 nm-line and space (L/S). The line width of the inner marks 80a to 80d is, for example, 150 nm.

Next, in step S212, the semiconductor substrate 4 is heated by a heating apparatus such as a hot plate or an oven. The resist patterns 46 and the monitor marks on the heated semiconductor substrate 4 flow as shown in FIG. 16. By allowing the resist patterns and the monitor marks to flow as shown in FIG. 16, the line widths of semiconductor chips are changed, providing resist patterns having desired line widths.

Figure 17:
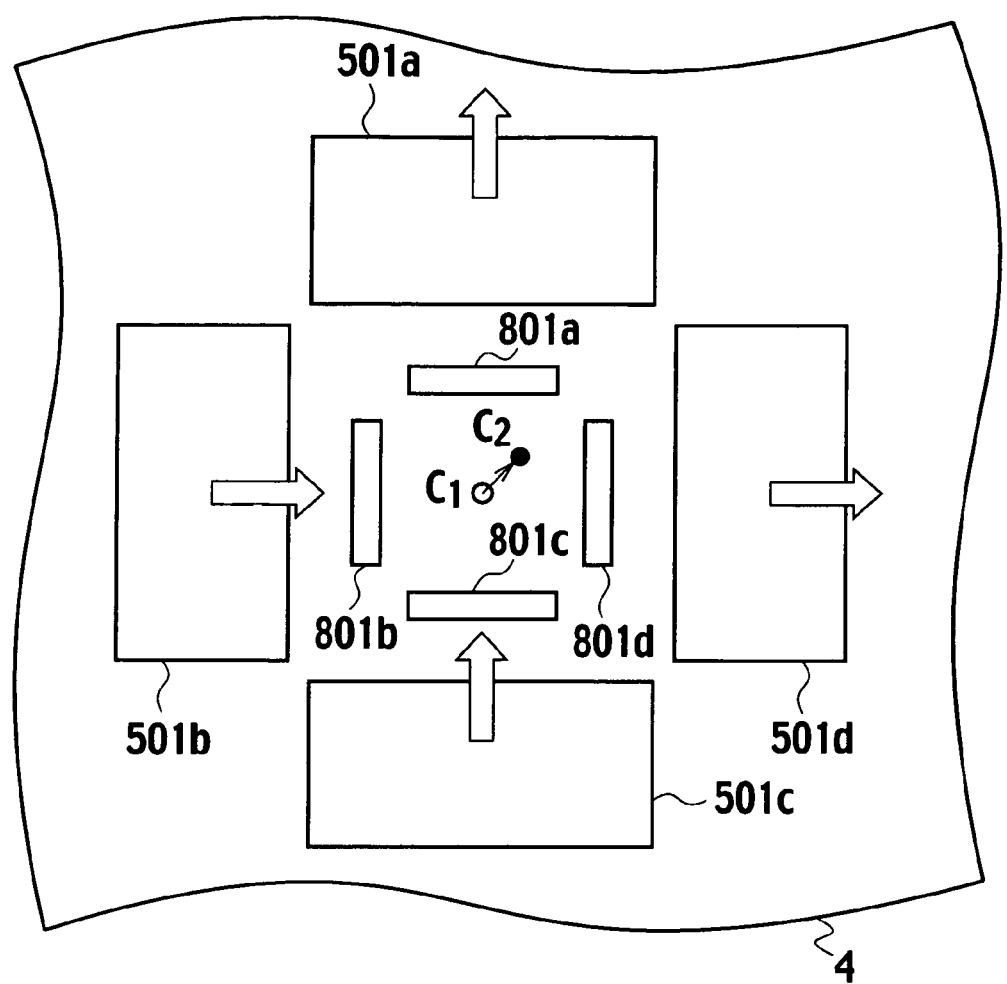
FIG. 17 is a plane view to show a change due to a flow of the monitor mark according to the second embodiment of the present invention.

Next, in step S123, the semiconductor substrate 4 is moved to a measuring apparatus (not shown) such as an optical misalignment inspection apparatus. Thereafter, the monitor marks are observed in a state in which fine lines are not resolved as shown in FIG. 17, because fine L/S is cannot resolved by an optical misalignment inspection apparatus. Due to the flow of the outer marks 50a to 50d, the outer marks 50a to 50d respectively move towards the positions where the first lines 52 with large line widths were placed. In other words, since modified outer marks 501a to 501d respectively move in the directions shown by thick arrows in FIG. 17, the center position $C_2$ of the modified outer marks 501a to 501d is moved in the direction shown by a thin arrow. The center position $C_1$ of modified inner marks 801a to 801d does not move since the inner marks 80a to 80d are single line patterns. Thereafter, by using an optical measuring apparatus, increases in line widths due to the flow are measured for each of the monitor marks scattered over the semiconductor substrate 4. The increases in line widths due to the flow for each of the monitor marks are obtained by measuring the center position $C_2$ of the modified outer marks 501a to 501d which have moved and the center position $C_1$ of the modified inner marks 801a to 801d, which have not moved for each of the two directions shown by the thick arrow then, average values of the measurements for both directions are obtained.

In step S214, based on the measurement results of the center position $C_2$ of the modified outer marks 501a to 501d and the center position $C_1$ of the modified inner marks 801a to 801d, variations in increases in line widths, due to the flow, measured for each of the monitor marks scattered on the wafer are compared to each other. In accordance with the set specified value, chips arranged in an area where a large variation in increases in line widths is observed due to the flow are removed as waste chips.

Figure 18:
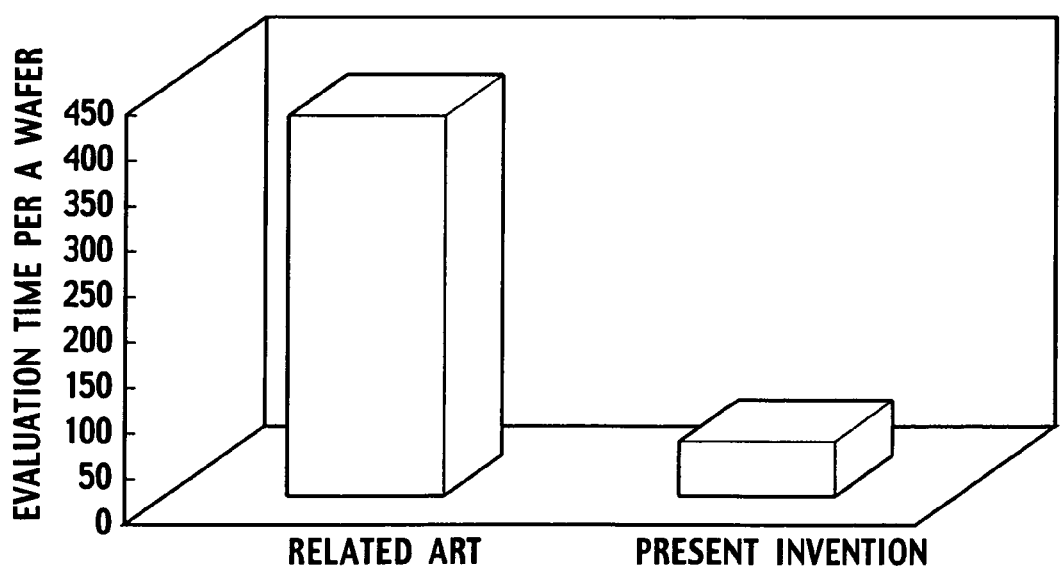
FIG. 18 is a graph comparing measurement time using a monitor mark according to the second embodiment of the present invention and measurement time using a conventional monitor mark.

According to the process control method of the second embodiment, by measuring the center positions of the monitor marks after the flow each having the outer marks 50a to 50d and the inner marks 80a to 80d, it becomes possible to control the magnitude of variation in increases in line widths due to the flow on the semiconductor substrate 4. Moreover, since increases in line widths due to the flow depend on heating temperature and duration, increases in line widths due to the flow within a wafer or between wafers vary because of uneven temperature of a heating apparatus or the like. A magnitude of variation in increases in line widths due to the flow on the semiconductor substrate 4 can be accurately measured by using an optical measuring apparatus such as a misalignment inspection apparatus without using an electronic measuring apparatus such as a CD-SEM. Therefore, variation in increases in resist line widths due to the flow can be controlled to provide a high throughput. To be more specific, time required for measurement of 30 monitor marks by a CD-SEM is 420 seconds as shown in FIG. 18 as it takes 7 seconds to measure each monitor mark and measurements of the same have to be carried out before and after heating in order to control variation in increases in resist line widths due to the flow. The time required for measurement of 30 monitor marks by a misalignment inspection apparatus is only 60 seconds since it takes 2 seconds to measure each monitor mark and the measurements of the monitor marks are carried out only after heating. Moreover, the center position of the inner marks 80a to 80d does not move even if they flow. Therefore, the monitor marks can be inspected using a normal alignment inspection method.

Modification of Second Embodiment

Figure 19:
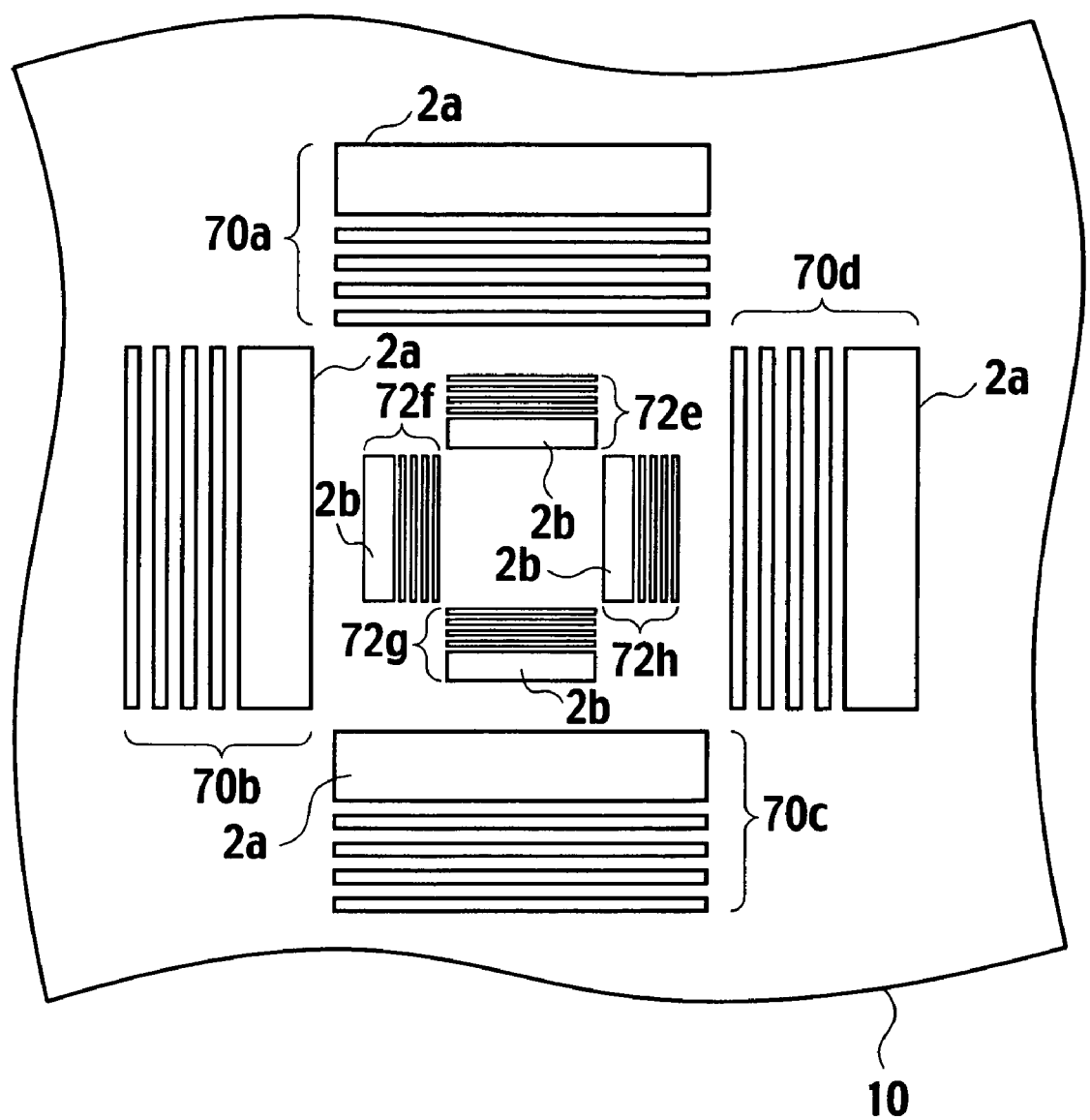
FIG. 19 is a plane view of a mask according to modification of the second embodiment of the present invention.

As shown in FIG. 19, a mask for process control according to a modification of the second embodiment of the present invention is different from the mask for process control shown in FIG. 12 in that four of the first mask patterns 20 according to the first embodiment are prepared and these first mask patterns 20 are combined and used as inner mask patterns 72e to 72h instead of the inner mask patterns 72a to 72d. The rest of the construction is substantially the same as the mask for process control shown in FIG. 12, and duplicated description is thus omitted.

As shown in FIG. 19, the inner mask patterns are divided into two sets: a set of inner mask patterns 72e and 72g which face each other in parallel, and a set of inner mask patterns 72f and 72h which face each other in parallel. These two sets of inner mask patterns 72e and 72g and the inner mask patterns 72f and 72h are place on four sides of the chip. The inner mask patterns 72e to 72h are mask patterns used to form a resist pattern in which the center position moves after the patterns flow. Of the inner mask patterns 72e to 72h, the patterns placed in parallel with each other are designed so that the center positions of the resist patterns move in the same direction. The center positions of the resist patterns formed by the inner mask patterns 72e to 72h and the patterns of the resist patterns formed by the outer marks 50a to 50d, which the inner mask patterns 72e to 72h are parallel therewith, respectively, move in opposite directions. In other words, in the inner mask patterns 72e and 72h, first line patterns 2a thereof are placed on the outer side of the inner mask patterns 72e to 72h. On the other hand, in the inner mask patterns 72f and 72g, first line patterns 2a thereof are placed on the inner sides of the inner mask patterns 72e to 72h.

Figure 20:
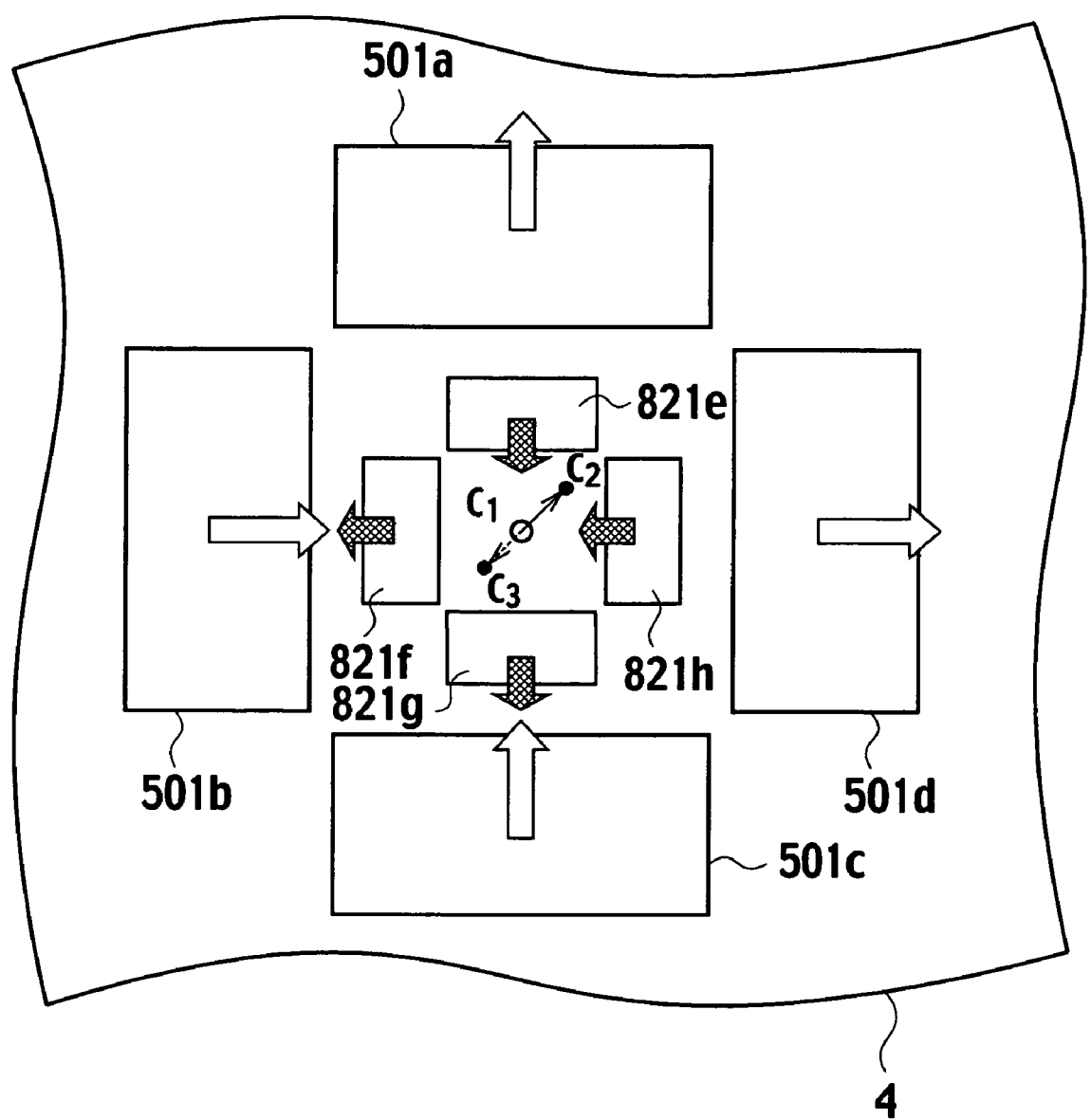
FIG. 20 is a plane view showing a change due to a flow of the monitor mark according to modification of the second embodiment of the present invention.

The monitor marks formed on the semiconductor substrate 4 by using the mask for process control, according to the modification of the second embodiment, flow by being heated by a heating apparatus such as a hot plate or an oven. The semiconductor substrate 4 is moved to a measuring apparatus such as an optical misalignment inspection apparatus and observed. With an optical misalignment inspection apparatus, fine L/S is not resolved. Therefore, the monitor marks are observed as shown in FIG. 20. Due to the flow of outer marks 50a to 50d and inner marks 82e to 82h, the outer and inner marks move towards positions where the first lines 52 with large pattern line widths were placed. In other words, since modified outer marks 501a to 501d move in directions indicated by thick outline arrows, the center position $C_2$ of the modified outer marks 501a to 501d moves in a direction shown by a thin solid arrow. On the other hand, since modified inner marks 821e and 821h move in directions indicated by thick black arrows, the center positions $C_3$ of the modified inner marks 821e to 821h move in a direction shown by a thin broken-line arrow. Further, the center position $C_2$ of the modified outer marks 501a to 501d and the center position $C_3$ of the modified inner marks 821e to 821h can be measured by an optical measuring apparatus. Since the center position $C_2$ of the modified outer marks 501a to 501d and the center position $C_3$ of the modified inner marks 821e to 821h shift in directions opposite to each other, relative measurement sensitivity is doubled.

According to the modification of the second embodiment, by measuring each of the center positions of the monitor marks, each having outer marks 50a to 50d and inner marks 80e to 80h, after the flow, it becomes possible to control a magnitude of variation in increases in line widths due to the flow in the semiconductor substrate 4. Further, since increases in line widths due to the flow depend on heating temperature and duration, uneven temperature or the like of a heating apparatus causes a variation in increases on line widths due to the flow within a wafer or between wafers. A magnitude of variation in increases in line widths due to the flow on the semiconductor substrate 4 can be accurately measured by an optical measuring apparatus such as a misalignment inspection apparatus without using an electronic measuring apparatus such as a CD-SEM. Therefore, variation in increases in resist line widths due to the flow can be controlled to provide a high throughput.

Other Embodiment

In the first embodiment, it was described that monitor marks are formed using a mask for process control. However, monitor marks may be directly drawn by an electron beam without using a mask for process control.

In the first embodiment, it was described that a negative resist is used for the resist 44. However, a positive resist may be used by changing processes as appropriate.

Various modifications will become possible for those skilled in the art after receiving the teachings of the present disclosure without departing from the scope thereof.

What is claimed is:

1. A process control method comprising:
   forming an inspection pattern by a resist having a first line and a plurality of second lines having a line width smaller than that of the first line pattern and being parallel with the first line, and a reference pattern being in the orthogonal direction to the direction in which the first line extends on a semiconductor substrate;
   flowing the inspection pattern and the reference pattern by heating the resist;
   measuring the distance between the center of the inspection pattern and the reference pattern after flowing the inspection pattern and the reference pattern; and
   checking the magnitude of variation in increases of line widths of the inspection pattern and the reference pattern after the flowing the inspection pattern and the reference pattern, based on the measurement result of the distance between the centers.

2. The process control method of claim 1, wherein the reference pattern has a plurality of lines of a single line width.

3. The process control method of claim 1, wherein the reference pattern is a single line pattern.

4. A process control method comprising:
   forming four outer marks in a rectangular shape by a resist, divided into two orthogonal sets of marks, each of the outer marks having a first line and a plurality of second lines having a line width smaller than that of the first line and in parallel with the first line, and four inner marks being arranged in a rectangular shape on inner sides of the outer marks parallel with the outer marks respectively on a semiconductor substrate;

flowing the outer marks and the inner marks by heating the resist;

measuring the distance between the center of the outer marks and the inner marks after flowing the outer marks and the inner marks; and checking the magnitude of variation in increases of line widths of the outer marks and the inner marks after the flowing the outer marks and the inner marks, based on the measurement result of the distance between the centers.

5. The process control method of claim 4, wherein the inner mark has a plurality of lines of a single line width.

6. The process control method of claim 4, wherein the inner mark is a single line pattern.

7. The process control method of claim 4, wherein the inner mark is divided into two sets of marks facing each other and placed on four sides of a chip the two sets of marks having a first line and a plurality of second lines having a line width smaller than that of the first line pattern and being in parallel with the first line.

8. A method for forming a monitor mark configured to measure a distance between the center of an inspection pattern and a reference pattern after a flow process, comprising:

forming the inspection pattern in a rectangular shape by a resist having a first line and a plurality of second lines having a line width smaller than that of the first line and being parallel with the first line, and a reference pattern being in the orthogonal direction to the direction in which the first line pattern extends on a semiconductor substrate; and flowing the inspection pattern and the reference pattern by heating the resist.

9. The method of claim 8 wherein the reference pattern has a plurality of lines of a single line width.

10. The method of claim 8, wherein the reference pattern is a single line pattern.

11. A method for forming a monitor mark configured to measure a distance between the center of four outer marks and four inner marks after a flow process, comprising:

forming the outer marks in a rectangular shape by a resist, divided into two orthogonal sets of marks, each of the outer marks having a first line and a plurality of second lines having a line width smaller than that of the first line and in parallel with the first line, and the inner marks being arranged in a rectangular shape on inner sides of the outer marks parallel with the outer marks respectively on a semiconductor substrate; and flowing the outer marks and the inner marks by heating the resist.

12. The method of claim 11, wherein the inner mark has a plurality of lines of a single line width.

13. The method of claim 11, wherein the inner mark is a single line pattern.

14. The method of claim 11, wherein the inner mark is divided into two sets of marks facing each other and are placed on four sides of a chip having a first line and a plurality of second lines having a line width smaller than that of the first line pattern and being in parallel with the first line.

15. A mask for process control flowing of an inspection pattern and a reference pattern having a first line and a second line which were projected by heating an exposure object, and measuring the distance between, the center of the inspection pattern and the reference pattern after a flow, comprising:

a mask substrate;

a first mask pattern having a first line pattern and a plurality of second line patterns having a line width smaller than that of the first line pattern and being parallel with the first line pattern, the first mask pattern being formed on the mask substrate; and a second mask pattern having a third line pattern being in the orthogonal direction to the direction in which the first line extends, and being formed on the mask substrate.

16. The mask of claim 15, wherein the third line pattern has a plurality of lines of a single line width.

17. The mask of claim 15, wherein the third line pattern is a single line pattern.

* * * * *